United States Patent [19]

Dhanakoti et al.

[11] Patent Number: 4,927,692

[45] Date of Patent: May 22, 1990

[54] ANTISTATIC MASK FOR USE WITH ELECTRONIC TEST APPARATUS

[75] Inventors: Padmanabhan Dhanakoti, Austin; Gerry W. Moore, Valley Mills; Harold F. Smith, Cedar Park, all of Tex.

[73] Assignee: International Business Machines Corporation, Armonk, N.Y.

[21] Appl. No.: 275,890

[22] Filed: Nov. 25, 1988

[51] Int. Cl.$^5$ ............................................. B32B 3/00
[52] U.S. Cl. .................................... 428/137; 428/211; 428/413; 428/537.5; 428/922; 430/5; 430/23
[58] Field of Search ...................... 430/5, 23; 428/137, 428/211, 413, 537.5, 922

[56] References Cited

U.S. PATENT DOCUMENTS

| | | | |
|---|---|---|---|
| 3,834,926 | 9/1974 | Labana et al. | 430/23 |
| 3,868,359 | 2/1975 | Sheppard et al. | 260/173 |
| 3,949,131 | 4/1976 | Fraser | 428/201 |
| 4,033,928 | 7/1977 | Randell et al. | 260/45.8 R |
| 4,141,911 | 2/1979 | Matsumoto et al. | 260/438.5 R |
| 4,234,648 | 11/1980 | Patz et al. | 428/245 |
| 4,292,105 | 9/1981 | Taylor | 156/242 |
| 4,330,444 | 5/1982 | Pollman | 523/404 |
| 4,336,366 | 6/1982 | Berner et al. | 528/89 |
| 4,351,708 | 9/1982 | Berner et al. | 204/159.23 |
| 4,393,177 | 7/1983 | Ishii et al. | 525/422 |
| 4,486,490 | 12/1984 | Patz et al. | 428/245 |
| 4,560,709 | 12/1985 | Berner et al. | 204/159.14 |
| 4,560,715 | 12/1985 | Ueeda et al. | 523/443 |

FOREIGN PATENT DOCUMENTS 156396 7/1987 Japan .

*Primary Examiner*—Patrick Ryan
*Attorney, Agent, or Firm*—Robert M. Carwell

[57] ABSTRACT

A laminated antistatic electrical test mask for use with bed-of-nails test equipment in analyzing electrical properties between locations on a circuit board or card wherein the mask material prevents unused probes from contacting the product to be tested. The mask includes a plurality of layers comprised alternatively of cured glass cloth and a hygroscopic material, with a plurality of apertures disposed through the mask for receipt of test probes. In a particular embodiment, the layers are comprised of prepreg and a cellulose-containing material such as bonded paper. Electrostatic charges are more evenly distributed throughout the multiple layers of the composition to reduce charge densities presented to the test probes thereby significantly reducing destruction of JFETs associated with the probes from electrostatic discharge therethrough.

20 Claims, 6 Drawing Sheets

ANTISTATIC MASK FOR USE WITH ELECTRONIC TEST APPARATUS

DESCRIPTION

1. Technical Field

The present invention relates to circuit board and/or card electrical testing apparatus and, more particularly, relates to mask materials employed to prevent probes in bed-of-nail type testers from contacting the product to be tested.

2. Background Art

Bed-of-nails type electrical testers have long been employed in the art for automatic testing of electrical properties exhibited between numerous preselected locations on a given electronic card or circuit board (hereinafter referred to collectively as a board). Essentially such test apparatus works as follows. A test jig is provided for receiving the board under test. A header assembly carries a plurality of nail-like test probes pendantly disposed therefrom with conductors routed from each probe to appropriate analyzer circuitry well known in the art. An insulative antistatic mask is disposed intermediately between the header and the board under test and is predrilled with a preselected hole pattern so as to permit passage through holes in the mask of only those probes which are desired to contact the board surface at preselected locations for testing. This hole pattern in the mask will accordingly correspond to the pattern defined by locations on the board which are to be tested. Accordingly, for simplicity in description, if it is desired to check for an open or short circuit between points A and B on a printed circuit board, the hole pattern in the mask will be such that probes will be admitted through appropriately located holes in the mask so as to contact points A and B. Other probes adjacent or between these points A and B which might interfere with the testing will be prevented by absence of holes at these locations in the mask from extending through the mask so as to touch the card. At times such a mask was also provided below the board under test to further isolate the board from charges and electrical potentials which might adversely affect the tests.

Numerous systems have been provided for automating various sequential electrical tests between such probes due to the large numbers of tests and test points which must be used in complex modern high density boards. Accordingly, it will be further appreciated that if the tester is to be of general purpose to accommodate wide varieties and close spacing of test points presented by numerous different boards to be tested, the number of test probes with associated circuitry must be exceedingly large and densely spaced. It is thus conventional to encounter test probe heads with in excess of 20,000 such probe pins within a 1.04 square foot area. Testers conventionally provide a pair of JFET (junction field effect transistors) associated with each probe the significance of which will become readily apparent shortly in the discussion of the improvements provided by the subject invention which is to follow.

A serious problem which has continued to plague the industry is the destruction of JFET switches caused by electrostatic discharge from the mask through the test apparatus including the JFETs. JFETs typically employed have relatively low breakdown voltages on the order of 10–50 volts whereby any voltage introduced in excess thereof between the gate and the source or drain results in destruction of the JFET. The exact mechanism responsible for such switch destruction has been presented at the Worldwide Test Conference in Austin, Tex., October 1983. It has been found that due to the insulative properties of conventional mask material such as bakelite, pvc, phenolics, glass materials and the like, extremely high voltage static pockets on the order of ±10–30 kilovolts are not infrequently encountered disposed about the mask due to friction associated with movement of the masks during a test procedure and the like. Given the aforementioned relatively low break down voltage of the JFET switches, it can be appreciated now why the industry frequently encounters destructive break down of the switches when the probes associated therewith contact such high voltages associated with these high charge density concentrations. The insulative properties of the mask material giving rise to destructive charge concentrations is in some instances even exacerbated by boards which must be tested after an insulative epoxy protective coat sometimes known as a "procoat" is applied to the board.

Numerous attempts have been made to solve the static electricity problem all of which have been found to suffer serious drawbacks. For example, ion blowers such as those releasing positive and negative ions from a radioactive source have been installed on test apparatus in the hope of providing a deionizing function to neutralize static charges on the top of the mask. Such an approach was found to be ineffective for numerous reasons. First, it was difficult to locate blowers sufficiently close to the test apparatus due to the typical moving shuttle-type operation of such machines. A related problem was that the mask top was accordingly disposed in the deionizing zone of influence of the blowers for insufficient time to neutralize the static charges. Moreover, due to structural constraints associated with conventional test apparatus, it was difficult to provide for neutralization of the bottom mask which was often more susceptible to static charge due to a greater undisturbed surface with fewer holes therethrough.

Yet another attempt to solve the static problem was a bleeder resistor technique wherein bleeder resistors were connected to the boards to drain off the offending charges. However, this approach was also found to be ineffectual. Often in the testing procedure the test equipment is inspecting for electrical opens between probes typically defined as being an open circuit resistance on the order of 100 megohms or greater. Bleeder resistors in order to provide a sufficiently low time constant to effect rapid enough charge drain to solve the problem typically had to be on the order of 3–6 megohms or lower. However, such comparatively low resistances with respect to an open circuit detection threshold corresponding to perhaps 100 megohms or more provided false indications of shorts whereby in essence the bleeder resistance was being detected. By increasing the bleeder resistance sufficiently to avoid adverse influence on the testing procedures, when interconnected into the probe switching circuits, charge could not release quickly enough to prevent transistor damage.

Still another approach was to apply an antistatic foam to the masks. However, this attempted solution provided unacceptable mechanical difficulties in maintaining secure attachment of the foam to the masks which undergo a substantial amount of trauma during the testing procedure.

Another approach which has been tried in the prior art was to introduce by means of an aerosol spray or other agency an antistatic chemical into the mask regions. However, the antistatic effects of such sprays were found not to last for sufficiently long periods of time. Other attendant problems were associated with these approaches such as inability to reach the bottom of the product under test, undesirable introduction of yet additional chemicals into the manufacturing process, time consumed in the spraying operation and the like.

Yet another approach was to introduce antistatic or conductive agents into the boards themselves. However these chemicals were found to leach out and thus become ineffective. Impregnation of boards with finely divided carbon particles was also attempted rendering the boards too conductive when in sufficient quantity to solve the electrostatic buildup problem.

Additional attempts included conductive mats or coverings, and grounded wrists straps and bags on the test operators and machines with obvious drawbacks. High humidity test environments were also tried with severe attendant worker discomfort, rusting of equipment, and adverse affects on test parameters.

Insulative masks such as those fashioned of the aforementioned bakelite or the like were known in the art but presented yet additional difficulties. While they nevertheless presented sufficient resistance, (unlike the bleeder resistor approach hereinbefore noted) so as not to adversely affect the electrical properties sought to be tested, these masks as insulators were also typically well suited to retaining the aforementioned destructive high voltage concentrations of charge.

Moreover, with respect to such materials, difficulties were encountered in the mechanical properties associated therewith. It must be appreciated that such a mask must, as previously noted, be capable of withstanding machining and drilling operations so as to dispose in excess of 20,000 probe-receiving holes therethrough concentrated in an area sometimes as little as 100 probes per square inch. In order to accommodate such a large number of test probes within a relatively small area very little material would remain to provide the mechanical strength necessary for such a mask to endure as many as a thousand test passes and resultant movements of the mask per shift. For example, it was not uncommon to require holes of an 80 mil diameter on 100 mil centers thereby leaving only 20 mils or less than 1/32 of an inch of material between holes. It was found that some materials while nominally coming closer at least to providing the desired electrical properties of a mask simply could not withstand such machining and/or subsequent hard use, often becoming quite brittle with the concentration of holes and ultimately shattering during the machining or test operations. Other such materials had equally as undesirable characteristics which included strong and highly offensive odors associated with phenolics encountered during the machining process and the like. Still other materials which in some cases were found to be easier to machine and less insulative and thereby less prone to lending themselves to undesirable charge concentrations were found to be too conductive as in the case of the carbon impregnation approach, contributing to false short indications in the test procedure.

Repeated failure of these attempted solutions to the electrostatic problem which continued over a period of years in the industry suggested that the problem was insoluble and yet the seriousness of the problem remained. The serious problems associated with electrostatically charged JFET switch shortings can be readily appreciated including the excessive down time of the expensive test facility and associated trouble shooting to detect which of the 40,000+JFETs were destroyed (not to mention repair difficulties). Yet further difficulties can be appreciated given the foregoing in finding a mask material with the exacting necessary properties of mechanical strength (given the extremely high probe hole density and rough handling of the mask) and unique electrical properties. With respect to the latter, the mask material must be sufficiently insulative so as to not short out probes giving false short readings when the probes used for test points inadvertently contact the sides of the apertures in the mask through which they extend. Moreover, however, such mask material must also not have an excessively resistive or insulative property so as to develop and retain concentrated charge densities which give rise to the destructive discharge through the JFET switches. Rather such a mask must desirably provide some mechanism whereby a substantially reduced and more uniform charge density could thereby be provided. With respect to the desired electrical properties alone, seemingly mutually inconsistent design goals resulted: a material which was not too insulative yet not too conductive while at the same time providing sufficient enlarged surface areas (in square footage predefined by the test bed) for reducing charge density and effecting a more uniform or unconcentrated distribution thereof. This strongly suggested that the solution lay in other perhaps radical types of approaches thus explaining the aforementioned sprays, foam materials, bleeder resistors, conductive bags or the like. In summary, the approach of providing a mask material itself with the necessary mechanical strength and electrical properties seemed hopeless and utterly futile.

SUMMARY OF THE INVENTION

A laminated antistatic electrical test mask is provided for use with bed-of-nails test equipment in analyzing electrical properties between locations on a circuit board or card wherein the mask material prevents unused probes from contacting the product to be tested. In one embodiment the mask includes a plurality of layers comprised alternately of a relatively insulating material such as epoxy resin-cured glass cloth or prepreg and a relatively conductive fibrous hygroscopic material such as paper or other cellulose-containing material, with a plurality of apertures disposed through the mask for receipt of test probes. Electrostatic charges are more evenly distributed throughout the multiple layers of the composition to reduce charge densities presented to the test probes thereby significantly reducing destruction of JFETs associated with the probes from electrostatic discharge therethrough.

BRIEF DESCRIPTION OF THE DRAWINGS

The novel features believed to be characteristic of the invention are set forth in the appended claims. The invention itself, however, as well as other features and advantages thereof, will be best understood by reference to the following description of the preferred embodiment, when read in conjunction with the accompanying figures, wherein:

DETAILED DESCRIPTION OF THE PREFERRED EMBODIMENT

Figure 1:
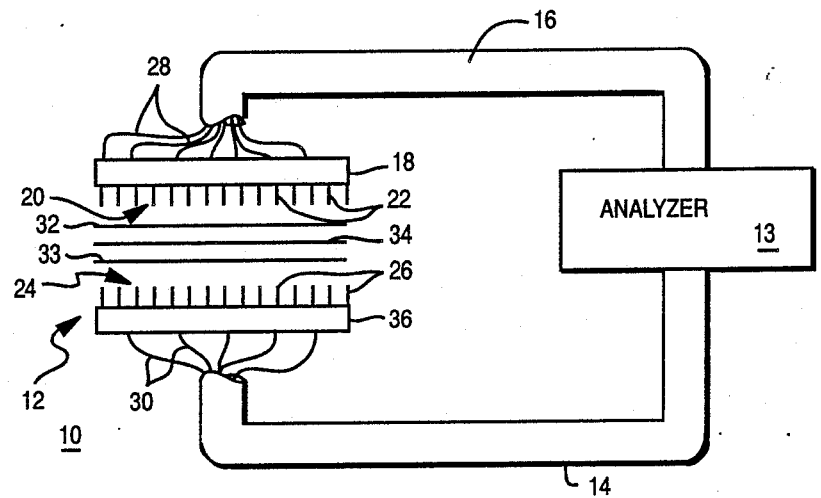
FIG. 1 is a pictorial view of a typical bed of nails tester shown with the antistatic masks of the present invention and a card disposed therein ready for testing procedures.

Referring now to FIG. 1 there is depicted therein generally a test facility 10 of the conventional bed-of-nails type well known in the art which includes a test bed 12, analyzer 13 (including associated switching matrices, logic, probe energizing and measuring circuitry, and the like) and pluralities of conductors 14 and 16 providing electrical interconnection between probes and the analyzer 13. The apparatus depicted in FIG. 1 is intended to be a general functional representation of such testers, a representative example of which is manufactured by DITMCO (The Drive In Theatre Manufacturing Co., 5612 Brighton Terrace, Kansas City, Mo. 64130. The invention is not intended to be limited to application to any particular tester environment but rather provides a generalized solution to any environment wherein the problems discussed herein relating to electrostatic discharges and mechanical properties are encountered including application to a wide variety of testers with JFETs in a switching matrix.

Continuing with FIG. 1, the test facility 10 further typically includes a tester head 18 having pendantly disposed therefrom a probe field 20 comprised of a plurality of probes 22 arranged substantially in planar configuration and extending generally downwards. In some applications it is desirable to further include a similar probe field 24 with probes 26 extending upwards for purposes of testing underneath surfaces of boards carrying conductive patterns and/or components. Electrically interconnected to such probes 22 and 26 are corresponding test leads 28 and 30 for conveying test signals between the test bed 12 and the analyzer 13 and, more particularly, for permitting the measurement at analyzer 13 of various electrical parameters and properties of a card 34 under test (or, more specifically, such properties as exhibited between preselected surface locations on the card 34 engaged by probes).

A shuttle carriage 36 is typically provided for introducing the card 34 and associated antistatic masks 32 and/or 33 of the present invention into an appropriate position for the probes to perform the test functions of the facility 10 and for facilitating easy removal of the masks 32 and 33 and card 34 therefrom for easy replacement by a next card 34-mask-32, and/or 33 combination for performance of the next test operation.

In operation, antistatic masks are conventionally placed on opposing sides of the card 34 to be tested whereupon the mask-card sandwich is disposed on the shuttle carriage 36. The carriage 36 is thence brought into the position shown in FIG. 1 with the sandwich disposed between the probe field 20 and shuttle carriage 36. The tester head 36 is thence raised toward the card 34 until probes corresponding to mating holes disposed through the mask 32 extend through these holes so as to engage an outer upper surface of the card 34. Also, if desired, probes 26 may be introduced through apertures in lower mask 33 to contact desired test locations on the underneath side of card 34. At this point, the analyzer 13 provides test signals carried through the conductor bundles 14 and/or 16 to the respective test leads and probes and receives measurement signals therefrom as desired.

Figure 2A:
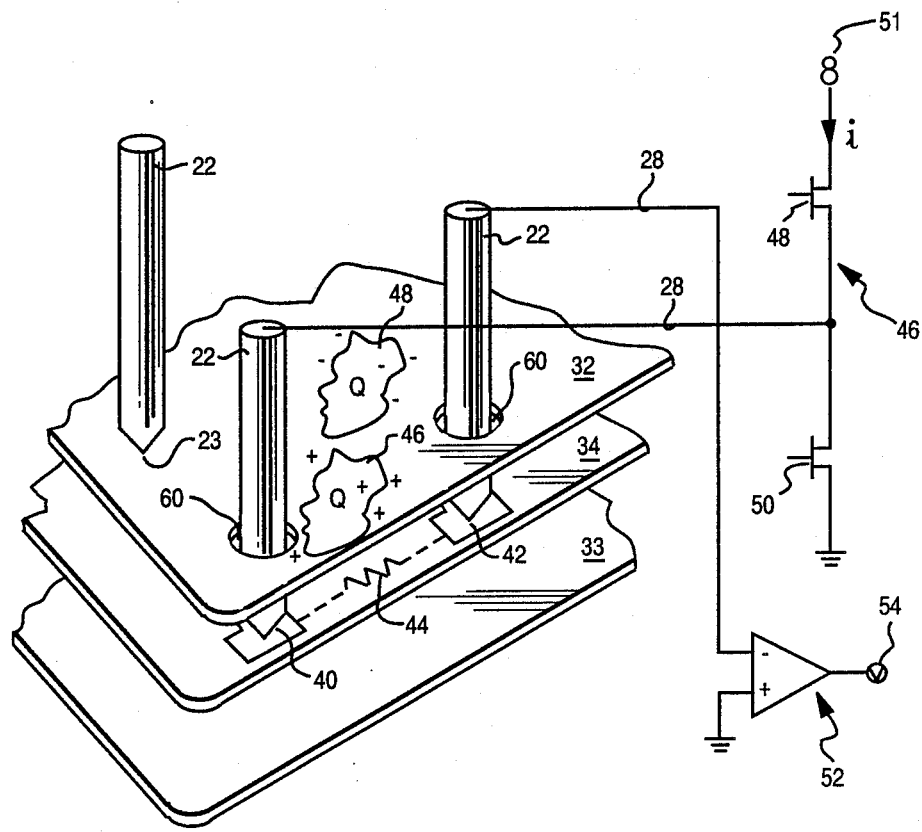
FIG. 2A is a pictorial and schematic view of a portion of the tester of FIG. 1 depicting in greater detail the masks, circuit board product to be tested, probes, and associated test circuitry of the tester.

Referring now to FIG. 2A, the function of the masks of the present invention such as mask 32 may be seen more clearly. With the probes 26 raised in a manner hereinbefore described, certain of these probes 26 will be prevented from contacting the card 34 under test by reason of absence of an aperture 60 at locations such as that shown at location 23. The hole pattern of the apertures 60 disposed through the mask 32 will be arranged so as to permit passage therethrough of only the probes 22 which are desired to contact the surface of card 34 at corresponding preselected locations on the surface of the card 34. Thus, for example, if it is desired to measure some electrical parameter schematically represented generally at reference numeral 44 between test points 40 and 42, apertures 60 will be disposed in the mask 32 so as to permit the appropriate probe pins 22 to extend through the mask 32 and contact their corresponding test points 40 and 42.

Still referring to FIG. 2A, functions performed by the analyzer 13 are illustrated only in a general and schematic way by the remainder of the figure. By means of switching matrices and control circuits provided by the analyzer 13, as a representative use of the probes being disposed in the manner just described, a test lead 28 will be interconnected to an energizing or ground source shown generally at reference 46 with a remaining test lead 28 being interconnected to an instrumentation amplifier 52. The source 46 may include a pair of JFET switches 48 and 50 and a constant current source 51. It will further be noted that the analyzer 13 will include some appropriate form of indicating device 54 such as a meter, recorder, lights, or the like as desired. By appropriate activation in combination of the switches 48 and 50, the probe 22 interconnected thereto may either have injected therein a source of test current or be brought to ground potential. Also through switching functions performed by the analyzer 13 well known in the art and not schematically represented in FIG. 2A, the other test lead 28 may be interconnected to the instrumentation amplifier 52 as desired so as to measure electrical potential of this test point 42 or some other electrical parameter relative to that of test point 40 which, as was previously described, may be brought to ground potential or injected with a source of current as desired under control of the analyzer 13 by means of the switches 48 and 50.

In FIG. 2A, on the surface mask 32 highly concentrated areas of positive and negative charges 46 and 48 may be seen schematically illustrated yielding substantially high charge densities and corresponding electrical potentials on the order of 10–30 kilovolts. With test probes 22 contacting such areas of high potential and charge 46 and 48, either by side contact with the mask 32 while extending through aperture 60 or due to surface contact at locations such as point 23 on the mask 32, a conductive discharge path is thereby created whereby the charges associated with these areas 46 and 48 may undesirably discharge through the probes 22. This results in voltages between the gates and the sources and/or drains of either or both of the switches 48 or 50 exceeding the gate-source or gate-drain breakdown voltages of the switching devices thereby leading to their damage or destruction. It is accordingly a significant feature of the instant invention to provide a mask 32 having properties whereby these charges represented by charge areas 46 and 48 are more evenly distributed so as to reduce the overall charge density and attendant destructive high potentials, thereby preventing the destruction of switches 48 and 50 when probes 22 contact the mask 32.

Figure 2B:
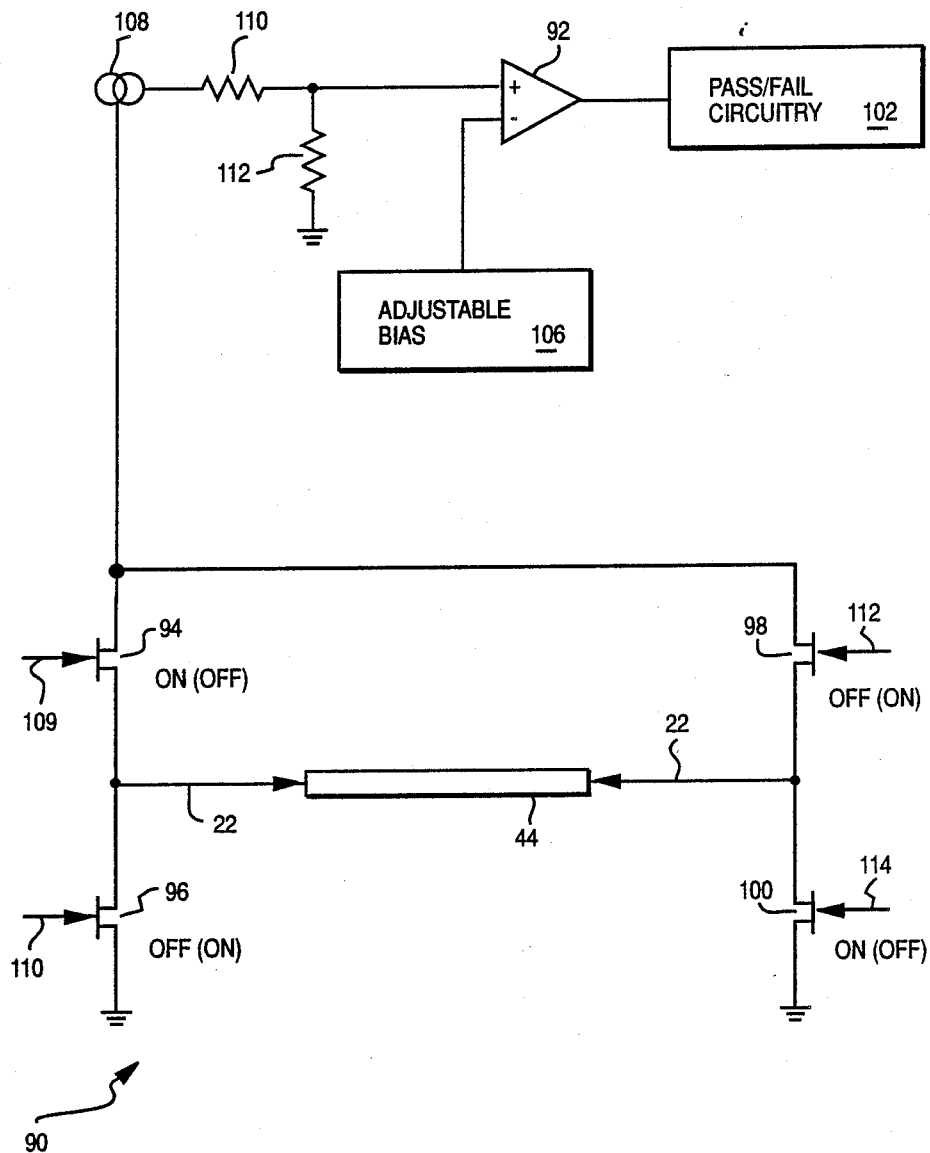
FIG. 2B is another schematic view of a portion of the tester of FIG. 1.

In FIG. 2B there is illustrated a more detailed schematic of a representative test circuit 90 employed with the mask of the invention. A first and second set of JFET switch pairs 94–96 and 98–100 are provided with each pair wired in series. Probes 22 are interconnected each from a respective one of the JFET pairs to opposing ends of the circuit under test 44. The upper end of the switch pairs 94–96 and 98–100 are energized with a constant current source 108 nominally of 20 milliamps DC. This current source 108 is further interconnected through a resistor network 110–112 to one input of a comparator 92, the other input of which is comprised of a positive adjustable biasing source 106. Output of the comparator 92 is routed to appropriate pass/fail circuitry 102. It will be noted that the arrangement of the aforementioned components 92, 102, 106, 110, and 112 may be implemented in a number of other ways by conventional analog operational amplifier circuitry well known in the art so long as the primary function of the components is provided of detecting level of current flow through the JFETs 94–100. Either set 94–100 or 96–98 of JFET switches may be employed for testing for continuity wherein the respective set is switched on to permit current flow through the circuit under test by conventional means for turning on JFET switches of energizing their respective gates 109, 110, 112 and 114 as required. However, for testing for shorts as is well known in the art only one positive stimulus switch is turned on and all other return switches (except points which contact the circuit) are turned on. It will be appreciated that the comparator bias 106 is adjustable to correspond to the maximum expected circuit-under-test resistance of the circuit 44.

Figure 3C:
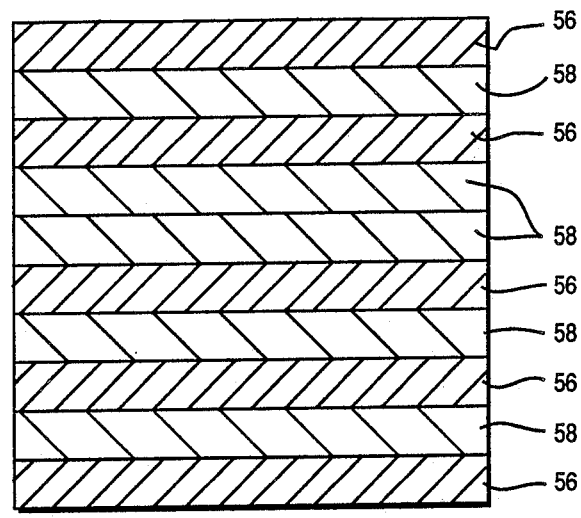
FIG. 3C is a schematic cross-section of the various layers of the material of the present invention prior to the laminating process.
Figure 3A:
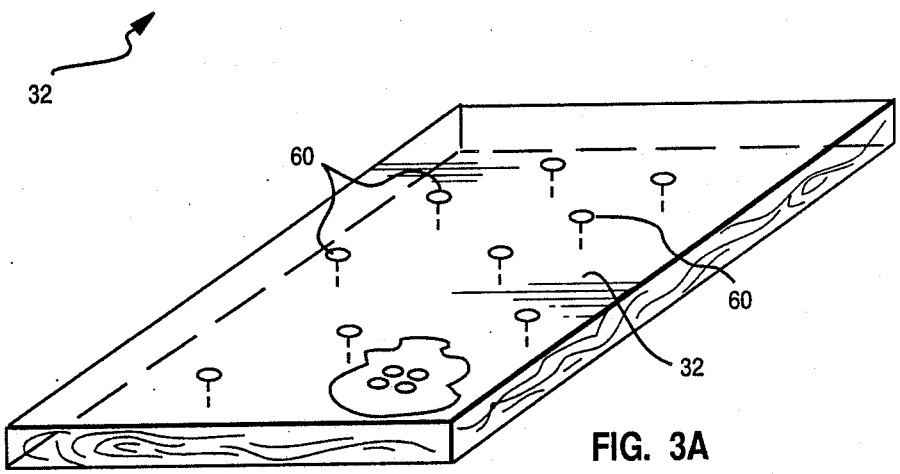
FIG. 3A is a pictorial view of a mask of the present invention illustrating a pattern of probe-receiving apertures disposed therethrough.

A pictorial view of a mask 32 of the present invention is shown in FIG. 3A to more clearly indicate the pattern of apertures 60 disposed therethrough generally normal to the plane defined by the large surface areas of the mask 32. It will be recalled that each aperture 60 of the pattern corresponds to a correlative probe 22 which is desired to be extend through the mask 32 in contact with the card 34 during the testing process. Thus, the pattern defined by the apertures 60 also corresponds to a like pattern defined by locations on the surface of card 34 to be contacted for testing of electrical properties between any given desired combination of such locations.

Figure 3B:
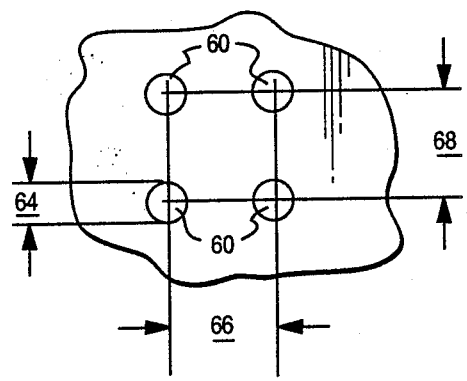
FIG. 3B is a top plan view of a portion of the mask of FIG. 3A depicting typical dimensions for the apertures and spatial positioning thereof.

In FIG. 3B the high hole density caused by close spacing of the aperture 60 to one another may be seen clearly illustrated. Although the invention is not intended to be limited to specific hole or spacing dimensions, it has been found that in one embodiment the following dimensions provide quite satisfactory results: aperture 60 diameters 64 nominally of 80 mils spaced on centers separated by 100 mils, whereby hole spacings such as shown by reference numerals 66 and 68 are nominally of the aforementioned magnitude of 100 mils.

FIG. 3C depicts schematically a particular embodiment of the mask 32 of the present invention in cross-section showing the various layers of material employed which comprise the mask 32 prior to the laminating and curing process to be hereinafter described. Layers 56 of a surface area and shape as desired (such as the rectangular shape shown in FIG. 3A) are comprised of a bond/offset paper. The layers 58 are comprised of an epoxy resin impregnated glass cloth a representative example of which is known in the industry as cured prepreg. When the layers of material shown in FIG. 3C undergo an appropriate lamination and curing process to be hereinafter described with reference to FIG. 4 and after an appropriate drilling operation thereafter to provide the apertures 60, a mask 32 of the present invention results.

Figure 4:
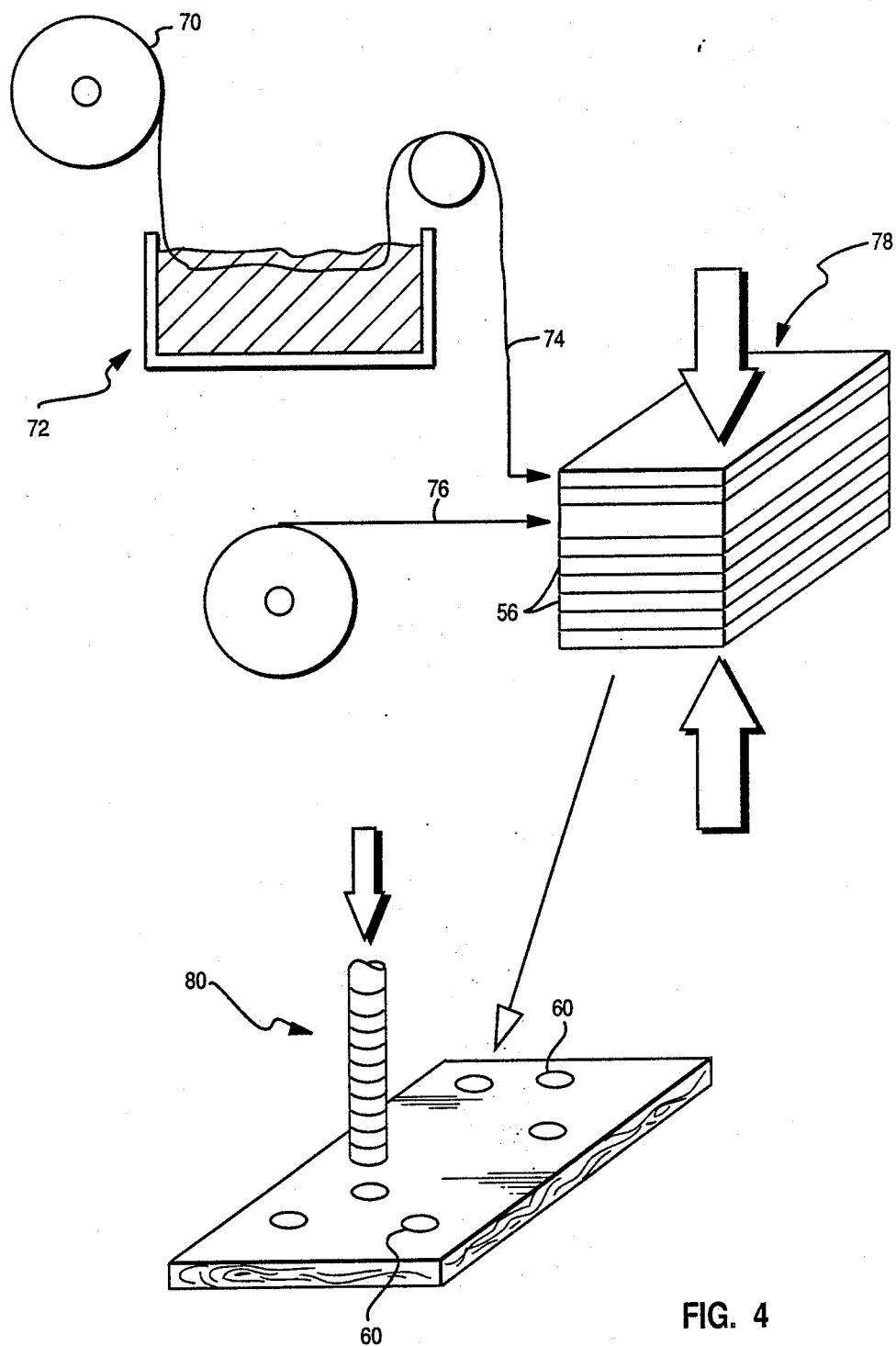
FIG. 4 is a schematic illustrating the manufacturing process in producing the antistatic mask of the present invention.

With reference to FIG. 4 there may be seen therein depicted in a schematic flow diagram form a representative process whereby the various layers of the composition of FIG. 3C are formed, laminated, and otherwise processed to yield the antistatic mask 32 of the present invention. First a commercially available glass cloth 70 is impregnated at 72 with an epoxy resin and cured in a manner well known in the art resulting in a length of cured prepreg material 74 typical of and widely used commercially in the printed circuit industry. This prepreg 74 is cut to the appropriate desired size to provide a number of layers thereof for subsequent lamination. In like manner, a hygroscopic material 76 such as bonded paper or other cellulose fiber-containing material is also cut to provide a number of layers 56 of substantially similar size to that of the cut prepreg material 74 in preparation for the subsequent lamination and other processes.

As shown in FIG. 4, next a lamination process 78 is performed. First the cut prepreg layers 74 and hygroscopic material layers 76 are interleaved as shown in FIG. 3C. The layered mask is then subjected to a conventional pressure-temperature lamination cycle, details of a representative example of which follow with reference to the accompanying table. In accordance with conventional laminating practice a planishing (not shown) plate may first preferably be laid out on top of which may be placed a layer of tedlar or the like which is optional but eliminates sticking of laminated products to the planishing plate during the lamination process. Next, the layers of material shown in FIG. 3C are disposed on the antiadherence layer such as the tedlar or the like upon which is optionally disposed a next layer of the tedlar or like material followed by the remaining upper planishing plate. This stack formed as described is thence placed into a conventional laminating press and sent through a normal laminating cycle as hereinafter described. After such laminating process 78, the emerging material may thence be drilled as indicated by drilling process 80 by conventional means known in the art to provide the required hole density and pattern adapted to receive the corresponding appropriate test probes 22 as desired. Additionally other miscellaneous machining operations may be performed as required and well known in the art such as cutting of the material to the desired size, notching for locating the mask 32 relative to the tester head 18, or the like.

Figure 5:
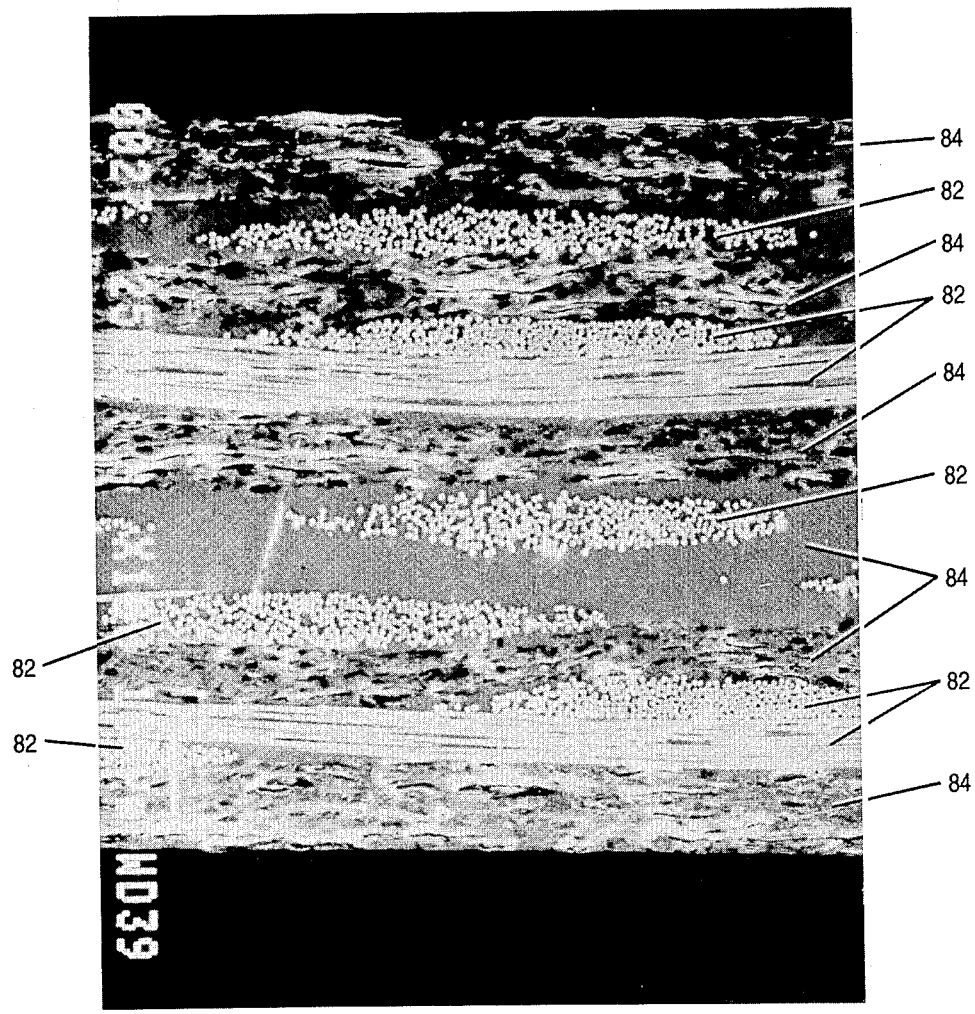
FIG. 5 is a micrograph of a cross-section of one embodiment of the antistatic mask of the present invention at 100 times magnification.
Figure 6:
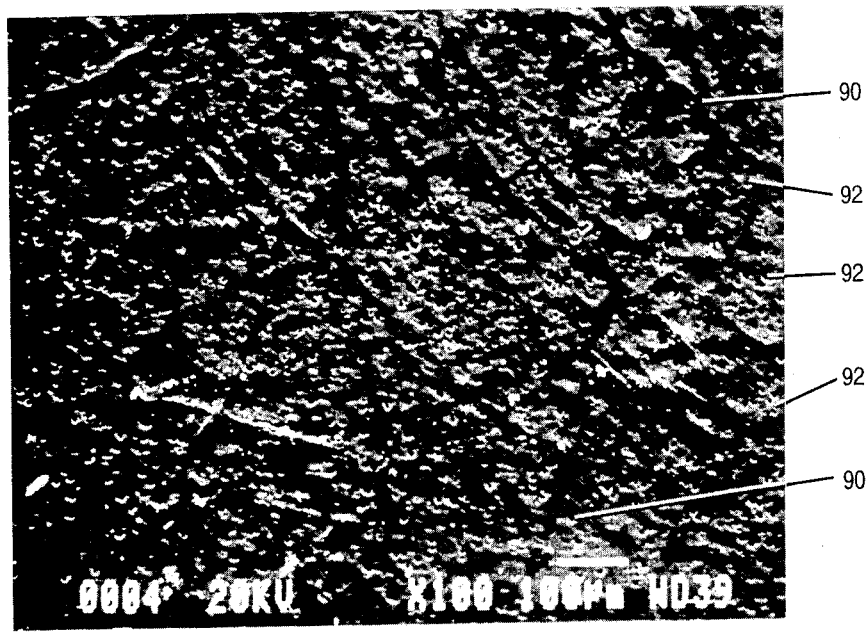
FIG. 6 is a micrograph of the surface topography of the embodiment of FIG. 5 at 100 times magnification.
Figure 7:
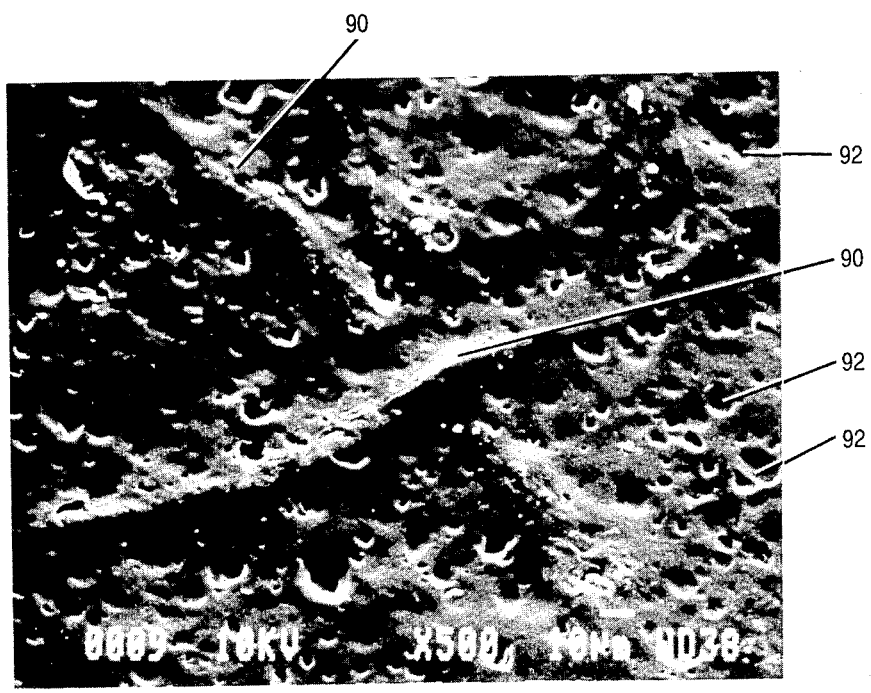
FIG. 7 is another micrograph of the surface topography of the embodiment of FIG. 5 at 500 times magnification.

FIGS. 5 and 6-7 depict side and surface topography views of an embodiment of the invention, respectively. The following may be seen clearly at the locations designated by respective reference numerals: paper (84), prepreg including glass fiber bundles (82), surface protrusions of paper from underlying prepreg fibers (90), and pores on the paper surface (92).

Referring to FIG. 5 in comparison FIG. 3C, it is apparent that during the lamination process the epoxy carried by the prepreg reflows and impregnates the hygroscopic material such as the paper whereby the various layers of hygroscopic material 82 and prepreg 84 are less uniform and discrete and commingle to some extent. It will be noted that in one embodiment it has been found desirable to provide adjacent layers of prepreg 58 as necessary internally of the mask 32 as shown in FIG. 3C for providing the desired mechanical strength properties of the material although this has not been found essential. The thickness of the embodiment depicted in FIGS. 5-7 is nominally 0.030-0.040 inches.

The following table summarizes the characteristics of an embodiment of the present invention.

TABLE 1

| | |
|---|---|
| Relatively conductive, hygroscopic, cellulose fiber-containing material 56 | 8 ply pink Spring Hill bond/offset blotter paper, IBM Part No. 6269243 |
| Relatively insulative layer material 58 | Epoxy resin impregnated glass cloth available as cured prepreg no. 280, IBM Part No. 9799321 |
| Lamination process 78 parameters: | |
| Temperature | 370° F. ± 5° |
| Pressure | 124 psi RAM pressure 225 ± 6 bar |
| Heat cycle | 70 minutes |
| Cool cycle | 50 minutes |
| Vacuum | none |
| Layup time | 1 load 72 masks, 15 books at 2.0 hours |
| Mask size | 4 sheets of size 10 × 15 inches each |
| Mask 32 properties | |
| Moisture content | 1.3-1.7% water content |
| Density | 1.706 grams per cubic centimeter (per ASTM D792) |

While the layers in the mask of the subject invention may be provided in a number of embodiments, one material found to be particularly effective is paper, providing a mechanism whereby moisture on the order of 1-5% by weight, or nominally 1.8%, is typically retained, given normal ambient plant process conditions and locations. Whereas the invention is not intended to be limited to a specific makeup of this layer or associated mechanisms or explanations as to why a particular embodiment having paper layers appears to be effective and preferred, nevertheless numerous factors are thought to contribute to such effectiveness of layers containing cellulose or other fibrous materials with like properties.

Foremost of these is the ability of cellulose fibers such as those present in paper or the like to retain moisture and distribute charges due to the conductivity of water and the tendency of the hydroxyl group of such fiber to bond ionically with water. Moreover, in conventional paper processing, bleaches are typically used whereby sodium bisulfite or other salt compounds are found present in the bleached paper which are water soluble and ionized in moist paper. Since water has a high dielectric constant of $\epsilon=78$ at 25° C., it is a powerful ionizing agent and presents a conductive surrounding for charge separation. The neutralization of charges occur and thereby static electricity is contained. This thereby is further believed to contribute to the dissipation or uniform spreading of potentially destructive electrostatic charge concentrations throughout the layers of hygroscopic material. Still further, paper materials used as the hygroscopic material are thought to be permeated with numerous crosslinkings of fibers contributing to retention of water in an amount sufficient for necessary conductivity and charge distribution without being excessively conductive so as to adversely affect test results. Also, other ions, both metallic and nonmetallic, typically found in papers further contribute to the desired distribution of electrostatic charges throughout these hygroscopic layers.

The invention is also not intended to be limited to any particular explanation as to the physical mechanism whereby the striking results of the invention are achieved. Nevertheless, it is believed that by providing a plurality of moderately conductive layers as in the case of paper, other cellulose-fiber containing materials, or other hygroscopic materials, the effective surface area through which electrostatic charges on the mask may be distributed is substantially increased. This in turn effectively reduces the high charge densities of the pockets of charge hereinbefore noted whereby corresponding locations of high electrical potential destructive of the transistor switches are thereby eliminated.

It will be recalled that if paths are provided through the mask which are excessively conductive, however, this may result in false short indication in the test apparatus as was the case with bleeder resistors. Thus, it is a feature of the subject invention to provide for a mask composition having layers of material moderately conductive in an amount sufficient to and in sufficient number to effectively distribute harmful electrostatic charges while at the same time being sufficiently resistive as to avoid the aforementioned false indications of shorts. One such material which has appeared to be effective in this respect providing multiple layers thereof for charge distribution is of course paper. However the invention is not intended to be limited to such embodiments and admits to substitution of other compositions of matter providing these objectives for the paper layers such as canvass, linen and blotting paper or saw dust.

In like manner, it was found that epoxy resin impregnated glass cloth such as that commonly known in the industry as "prepreg" serves quite satisfactorily as the alternate layers of the mask in providing the necessary mechanical strength, durability, relatively non-conductivity and machineability. However, again the invention is not intended to be so limited to embodiments only having this as the other layer. Accordingly, other compositions of matter such as polyimide in place of glass cloth impregnated with epoxy resin may be substituted therefor having substantially similar mechanical and electrical properties.

It is further thought that provision of conductive paths established between the relatively conductive layers serve to facilitate the destruction of charges amongst such layers so as to reduce charge densities. One such path is thought to be created on the outer edges or in the apertures of the mask during the shearing or cutting and drilling operations, respectively, whereby fibers of the conductive layers are brought in closer proximity. Accordingly the invention admits to and contemplates other means for accomplishing a substantially equivalent electrical interconnection between these layers.

While the invention has been shown and described with reference to particular embodiments thereof, it will be understood by those skilled in the art that the foregoing and other changes in form and details may be made therein without departing from the spirit and scope of the invention.

We claim:

1. An antistatic mask for use with a bed-of-nails type electronic card tester having a plurality of pin probes and electronic switches associated therewith comprising
    a plurality of first layers of a hygroscopic material;
    a plurality of second layers of insulative support material, each of said second layers being disposed between a different pair of said first layers; and
    a plurality of aperture means defined by and extending through said first and second layers and substantially normal to a plane defined by said first and second layers for receiving said pin probes.

2. The article of claim 1 wherein said hygroscopic material comprises cellulose fibers.

3. The article of claim 2 wherein said hygroscopic material is paper.

4. The article of claim 3 wherein said support material is comprised of glass cloth.

5. The article of claim 4 wherein said glass cloth is epoxy impregnated.

6. The article of claim 5 wherein said support material is comprised of prepreg.

7. The article of claim 1 wherein the thickness and number of said second layers are in amounts sufficient to maintain substantial rigidity of said mask when supported about the edges thereof.

8. The article of claim 7 wherein the conductivity and number of said first layers are in amounts sufficient to maintain electrostatic charge densities on or within said mask at levels nondestructive of said electronic switches when in electrical contact with said mask.

9. The article of claim 8 wherein said electronic switches are JFETs.

10. A laminated antistatic mask for use with a bed-of-nails type electronic card tester having a plurality of pin probes and electronic switches associated therewith for conducting electrical tests on said card, comprising first layer means for providing substantial support of said mask when supported about the edges thereof and penetrated by apertures for receiving said probes; and
    second layer means for reducing concentrations of electrostatic charges on or within said mask whereby damage to said electronic switches from said electrostatic charges is prevented when said switches are in electrical contact with said mask.

11. The article of claim 10 wherein said mask is comprised of a plurality of alternate layers of said first and said second layer means.

12. The apparatus of claim 11 wherein said alternate layer means are laminated together into an integral composition.

13. The article of claim 10 wherein said second layer means are sufficiently conductive to substantially uniformly distribute electrostatic charges throughout said mask, thereby reducing charge densities of said mask to levels non-destructive of said switches when in electrical contact therewith, while being sufficiently insulative as to not interfere with said tests.

14. The article of claim 12 wherein said switches are JFETs.

15. The article of claim 14 wherein said second layer means includes cellulose fibers.

16. An antistatic mask for use with electronic card testers having a plurality of probes and including transistor switches associated with said probes comprising a laminated mask having alternating layers of first and second materials and a plurality of probe-receiving apertures extending through said mask.

17. The article of claim 16 wherein said mask includes surface location means for preventing preselected ones of said plurality of probes from being disposed through said mask and into contact with said electronic card.

18. The article of claim 16 wherein said layers of said first material are
    sufficiently conductive to distribute electrostatic charges therein throughout said mask to reduce charge densities of said mask to levels non-destructive of said switches when in electrical contact with said mask through said probes; and
    wherein said layers of first material are further sufficiently non-conductive so as to prevent indications of false shorts detected by said tester between said probes when in contact with said mask.

19. The article of claim 18 further including electrically conductive path means interconnecting said layers of first material for conducting electrostatic charges on or within said mask to said layers of said first material of said mask thereby providing a larger conductive surface area for distribution of said charges whereby charge densities associated with said mask are reduced to levels non-destructive of said transistor switches.

20. The article of claim 19 wherein said conductive paths are provided on the outer edges of said mask or on portions of said mask defining one or more of said apertures.

* * * * *